(12) United States Patent
Lee

(10) Patent No.: US 8,518,610 B2
(45) Date of Patent: Aug. 27, 2013

(54) METHOD FOR FABRICATING PHOTOMASK

(75) Inventor: Jun Sik Lee, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 608 days.

(21) Appl. No.: 11/955,332

(22) Filed: Dec. 12, 2007

(65) Prior Publication Data

US 2009/0004574 A1    Jan. 1, 2009

(30) Foreign Application Priority Data

Jun. 27, 2007    (KR) ................ 10-2007-0063942

(51) Int. Cl.
*G03F 1/26* (2012.01)
*G03F 1/32* (2012.01)
*G03F 1/48* (2012.01)

(52) U.S. Cl.
USPC .................................................. 430/5

(58) Field of Classification Search
USPC ........................................ 430/5
See application file for complete search history.

(56) References Cited

U.S. PATENT DOCUMENTS

| 6,423,455 | B1 | 7/2002 | Tzu |
| 6,524,753 | B2 * | 2/2003 | Choi et al. .............. 430/5 |
| 6,635,393 | B2 | 10/2003 | Pierrat |
| 2006/0032833 | A1 * | 2/2006 | Kawaguchi et al. ......... 216/37 |
| 2009/0061327 | A1 * | 3/2009 | Sengupta et al. ............ 430/5 |
| 2009/0191472 | A1 * | 7/2009 | Chun ................................. 430/5 |

FOREIGN PATENT DOCUMENTS

| EP | 0454169 A2 * | 10/1991 |
| JP | 09-043830 | 2/1997 |
| KR | 10-2004-0057821 A | 7/2004 |
| KR | 10-2005-0001093 A | 1/2005 |
| KR | 10-2006-0074486 A | 7/2006 |
| KR | 10-2007-0068908 A | 7/2007 |

OTHER PUBLICATIONS

Grant, Roger and Claire, Grant & Hackh's Chemical Dictionary, Fifth Edition, 1987, McGraw-Hill, Inc., pp. 261 and 487.*

* cited by examiner

*Primary Examiner* — Mark F Huff
*Assistant Examiner* — John S Ruggles
(74) *Attorney, Agent, or Firm* — Kilpatrick Townsend & Stockton LLP

(57) ABSTRACT

Provided is a method for fabricating a photomask. The method includes the following processes. Light blocking patterns are formed on a mask substrate, and surface properties of the mask substrate on which the light blocking patterns are formed are changed into hydrophobicity. When the surface properties of the mask substrate are changed into the hydrophobicity, the mask substrate is treated using plasma gas. The plasma gas may be a gas mixture of trifluoromethane (CHF3), tetrafluoromethane (CF4), and hydrogen (H2).

8 Claims, 2 Drawing Sheets

METHOD FOR FABRICATING PHOTOMASK

CROSS-REFERENCE TO RELATED APPLICATIONS

The present application claims priority to Korean patent application number 10-2007-0063942, filed on Jun. 27, 2007, which is incorporated by reference in its entirety.

BACKGROUND OF THE INVENTION

The present invention relates to a method for fabricating a photomask, and more particularly, to a method for fabricating a photomask including a phase shift layer.

Various patterns in semiconductor devices are formed by photolithography. Recently, as semiconductor devices become highly integrated, various technologies for forming ultra-fine patterns are developing. In order to improve the resolution by using a mask pattern, patterns are formed using a phase shift mask including a phase shifter.

The phase shift mask increases resolution or depth of focus by using interference or partial interference of light to expose patterns having a desired size. That is, when light passes through a mask substrate, a phase difference of the light occurs according to whether the phase shifter exists or not. As a result, the light passing through the phase shifter has a reverse phase with respect to light passing through the other portion of the phase shift mask. Accordingly, since the light passing through a light transmitting portion and the phase shifter are out of phase, light strength becomes zero in a boundary area of the pattern to increase the resolution by disposing the shifter at an edge of the mask pattern.

In contrast to conventional fine pattern formation methods, a method using the phase shift mask can improve a resolution limit of the mask by approximately 30% by only changing the mask without adding a new apparatus. Therefore, the method is regarded as a next-generation semiconductor manufacturing technique. Examples of the phase shift mask include a half tone phase shift mask (half tone PSM) in which the transmission coefficient increases from zero to a predetermined level or value above zero. In the half tone PSM, a molybdenum silicon nitride (MoSiN)-based half tone phase shift layer is disposed between a chromium (Cr) light blocking layer of a conventional binary mask and a quartz (Qz) substrate.

However, nuclei of particles are adhered to the half tone phase shift layer and the quartz (Qz) substrate due to a catalytic reaction caused by exposure of light and the storage environment during the formation of a wafer, and then moisture is held to the nuclei of the particles to increase the size of the particles. Therefore, the particles are formed around fine patterns formed on the mask or on the quartz (Qz) substrate to thereby cause defective patterns. In some cases, it is so serious that the photomask must fall into disuse.

SUMMARY OF THE INVENTION

Embodiments of the present invention are directed to a method for fabricating a photomask that can improve a fabrication yield of a photomask by preventing contaminants from adhering and accumulating onto a mask surface.

In one embodiment, a method for fabricating a photomask includes: forming light blocking patterns on a mask substrate; and changing surface properties of the mask substrate into hydrophobicity.

In the changing of the surface properties of the mask substrate into the hydrophobicity, the mask substrate may be treated using plasma gas including hydrogen (H) gas. The plasma gas may be a gas mixture of trifluoromethane (CHF3), tetrafluoromethane (CF4), and hydrogen (H2). Preferably, a flow rate of the hydrogen (H2) of the gas mixture may be approximately 20 sccm.

In another embodiment, a method for fabricating a photomask includes: forming a phase shift layer on a mask substrate; forming a light blocking layer on the phase shift layer; patterning the light blocking layer and the phase shift layer; removing the light blocking layer in remaining regions except a light blocking region; and changing surface properties of the mask substrate into hydrophobicity.

In the changing of the surface properties of the mask substrate into the hydrophobicity, the mask substrate may be treated using plasma gas. The plasma gas may include hydrogen (H) gas. The plasma gas may be a gas mixture of CHF3, CF4, and H2. A flow rate of the hydrogen (H2) of the gas mixture may be approximately 20 sccm.

DESCRIPTION OF SPECIFIC EMBODIMENTS

Generally, in a semiconductor device fabrication environment, moisture of approximately 45% is present in a process chamber. In a photomask storage environment, a mask substrate or a phase shift layer contacts and reacts with sulfur dioxide (SO2) and ammonia (NH3). Hence, contaminants are generated on the mask substrate or the phase shift layer due to such reaction and an influence of the moisture. Nuclei of the contaminants are formed of ammonium sulfate $((NH_4)_2SO_4)$, and water molecules are held to the nuclei of the contaminants to gradually increase the size of contaminant particles.

In order to suppress the growth of the ammonium sulfate $((NH_4)_2SO_4)$, adsorption of the moisture on the mask substrate is blocked. Surface properties of the mask substrate become hydrophobic in order to block the adsorption of the moisture. As one example, the surface of the mask substrate is treated using plasma gas.

Figure 1:
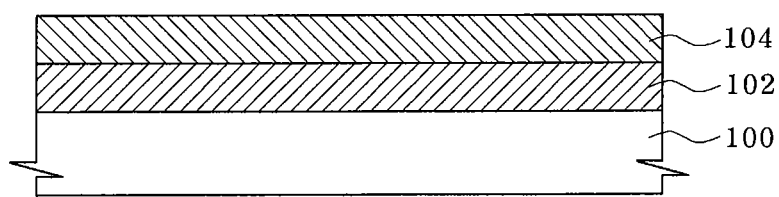
FIGS. 1 to 3 illustrate a method for fabricating a photomask according to one embodiment of the present invention.
Figure 2:
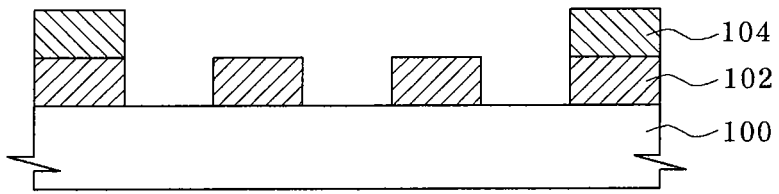
Figure 3:
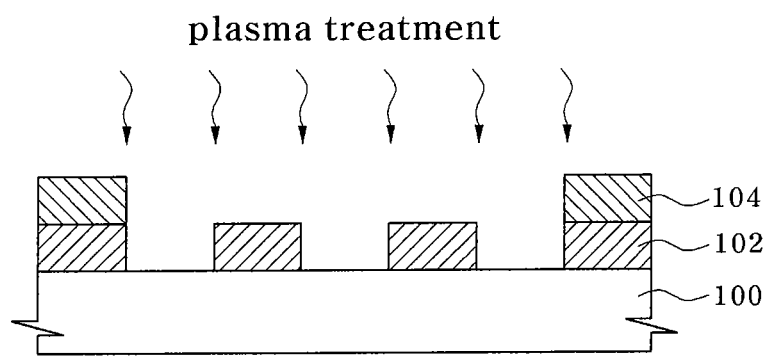

FIGS. 1 to 3 illustrate a method for fabricating a photomask according to one embodiment of the present invention.

Referring to FIG. 1, a transparent substrate 100, e.g., a quartz (Qz) substrate is prepared. A phase shift layer 102 is formed on the transparent substrate 100. The phase shift layer may be formed of, e.g., molybdenum silicon nitride (MoSiN). A chromium (Cr) layer is deposited on the phase shift layer 102 by a predetermined thickness to form a light blocking layer 104 defining a light blocking region.

Referring to FIG. 2, resist patterns (not shown) are formed on the light blocking layer 104. The light blocking layer 104 and the phase shift layer 102 are sequentially etched using the resist patterns as a mask. The resist patterns are removed and then the light blocking layer is removed in remaining regions except the light blocking region.

Referring to FIG. 3, in order to obtain hydrophobicity in the surface properties of the substrate on which the phase shift layer and the light blocking layer are patterned, the exposed surface of a result including the substrate 100 are treated. As one example, the substrate and the surfaces exposed on the substrate may be treated using plasma gas. A gas mixture of trifluoromethane ($CHF_3$), tetrafluoromethane ($CF_4$), and hydrogen ($H_2$) is used as plasma gas. The surface properties of the photomask become hydrophobic due to the plasma treatment to thereby prevent contaminants from adhering and accumulating onto the surface. Therefore, although nuclei of the contaminants are generated during the formation of the mask, growth of the nuclei of the contaminants is prevented because moisture is not adsorbed.

Figure 4:
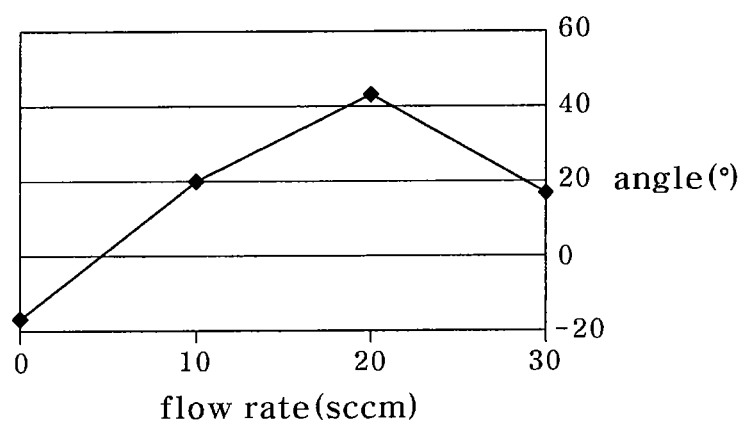
FIG. 4 illustrates an adsorption angle of a water molecule so as to detect an adsorption angle of a contaminated molecule according to a flow rate of hydrogen ($H_2$) gas.

FIG. 4 is a graph illustrating an adsorption angle of water molecules so as to detect an adsorption angle of contaminated molecules according to a flow rate of hydrogen gas $H_2$.

That is, after a phase shift mask is fabricated, a surface of the phase shift mask is treated using a gas mixture of $CHF_3$, $CF_4$, and $H_2$ as plasma gas. Then, when water molecules are adsorbed on the surface, a tilt angle of the water molecules is measured to illustrate the measured results in a graph. An internal pressure of a plasma treatment device is set at approximately 20 mTorr, a flow rate of the $CHF_3$ gas is set at approximately 30 sccm, and an internal power of the plasma treatment device is set at approximately 500 W.

As described above, when a flow rate of the $H_2$ gas is approximately 20 sccm, the tilt angle of the water molecules relative to the substrate is substantially maximized. That is, when the flow rate of the $H_2$ gas is approximately 20 sccm, hydrophobicity of the substrate surface is maximized. Accordingly, in the case that the substrate surface is treated using plasma gas in which the flow rate of the $H_2$ gas is set at approximately 20 sccm, the hydrophobicity of the substrate surface is maximized to substantially prevent adsorption of the contaminated molecules.

According to a method for fabricating the photomask of the present invention, after the photomask is fabricated, a surface treatment is performed for changing the surface of the photomask to be hydrophobic. The surface treatment is performed using the plasma gas including the $H_2$ gas. As a result, the surface properties of the photomask become hydrophobic to substantially prevent the adsorption of the contaminated molecules. Hence, although the nuclei of the contaminants are generated on the surface of the photomask during the formation of the mask, the growth of the nuclei of the contaminants is prevented because the moisture is not adsorbed. Therefore, the rate of defective photomasks can be reduced and the lifetime of the mask can increase. In addition, defective patterns can be reduced by preventing the contaminants from being transferred to patterns formed on a wafer.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a photomask, the method comprising:
    forming light blocking patterns comprising chromium material on a quartz (Qz) substrate; and
    performing a treatment process on an exposed surface of the quartz substrate to prevent an adsorption of contaminated molecules on the exposed surface of the quartz substrate by supplying plasma gas, wherein the plasma gas is a gas mixture of trifluoromethane ($CHF_3$), tetrafluoromethane ($CF_4$), and hydrogen ($H_2$), wherein a flow rate of the $H_2$ of the gas mixture is between 10 sccm and 29 sccm so that a tilt angle of a water molecule is between approximately 20° and 40° relative to the quartz substrate.

2. The method of claim 1, wherein the flow rate of the hydrogen ($H_2$) of the gas mixture is approximately 20 sccm so that the tilt angle of a water molecule relative to the quartz substrate is approximately 40°.

3. The method of claim 1, wherein the flow rate of the $H_2$ of the gas mixture is between 15 sccm and 25 sccm so that the tilt angle of a water molecule is between approximately 30° and 40° relative to the quartz substrate.

4. A method for fabricating a photomask, the method comprising:
    forming a phase shift layer on a quartz (Qz) substrate;
    forming a light blocking layer on the phase shift layer;
    patterning the light blocking layer and the phase shift layer;
    removing the light blocking layer except that provided at a light blocking region; and
    performing a treatment process on an exposed surface of the quartz substrate to prevent an adsorption of contaminated molecules on the exposed surface of the quartz substrate by supplying plasma gas, wherein the plasma gas is a gas mixture of trifluoromethane ($CHF_3$), tetrafluoromethane ($CF_4$), and hydrogen ($H_2$) , wherein a flow rate of the $H_2$ of the gas mixture is between 10 sccm and 29 sccm so that a tilt angle of a water molecule exceeds is between approximately 20° and 40° relative to the quartz substrate.

5. The method of claim 4, wherein the phase shift layer is formed using molybdenum silicon nitride (MoSiN).

6. The method of claim 4, wherein the light blocking layer is formed using chromium (Cr).

7. The method of claim 4, wherein the flow rate of the hydrogen ($H_2$) of the gas mixture is approximately 20 sccm so that the tilt angle of a water molecule relative to the quartz substrate is approximately 40 °.

8. The method of claim 4, wherein the flow rate of the $H_2$ of the gas mixture is between 15 sccm and 25 sccm so that the tilt angle of a water molecule is between approximately 30° and 40° relative to the quartz substrate.

* * * * *